(12) United States Patent
Umakoshi et al.

(10) Patent No.: US 8,852,462 B2
(45) Date of Patent: Oct. 7, 2014

(54) LIGHT-REFLECTIVE ANISOTROPIC CONDUCTIVE ADHESIVE AND LIGHT-EMITTING DEVICE

(75) Inventors: Hideaki Umakoshi, Tochigi (JP); Hidetsugu Namiki, Tochigi (JP); Masaharu Aoki, Tochigi (JP); Akira Ishigami, Tochigi (JP); Shiyuki Kanisawa, Tochigi (JP)

(73) Assignee: Dexerials Corporation, Tokyo (JP)

( * ) Notice: Subject to any disclaimer, the term of this patent is extended or adjusted under 35 U.S.C. 154(b) by 100 days.

(21) Appl. No.: 13/805,238

(22) PCT Filed: Mar. 14, 2012

(86) PCT No.: PCT/JP2012/056520
§ 371 (c)(1),
(2), (4) Date: Dec. 18, 2012

(87) PCT Pub. No.: WO2012/124724
PCT Pub. Date: Sep. 20, 2012

(65) Prior Publication Data
US 2013/0087825 A1 Apr. 11, 2013

(30) Foreign Application Priority Data

Mar. 16, 2011 (JP) ................. 2011-057818

(51) Int. Cl.
| | | |
|---|---|---|
| *H01B 1/00* | (2006.01) |
| *C08L 83/00* | (2006.01) |
| *H01L 33/62* | (2010.01) |
| *H01L 33/60* | (2010.01) |
| *H01B 3/00* | (2006.01) |
| *C08G 77/38* | (2006.01) |
| *C09J 183/06* | (2006.01) |
| *H01B 1/22* | (2006.01) |
| *H01L 33/46* | (2010.01) |
| *C09J 9/02* | (2006.01) |
| *C08K 5/09* | (2006.01) |
| *C08G 77/12* | (2006.01) |
| *C08K 3/22* | (2006.01) |
| *C08K 5/00* | (2006.01) |

(52) U.S. Cl.
CPC ............... *H01L 33/46* (2013.01); *H01L 33/62* (2013.01); *C08K 5/09* (2013.01); *C08G 77/12* (2013.01); *C08K 2003/2296* (2013.01); *H01L 33/60* (2013.01); *H01L 2224/45144* (2013.01); *H01B 3/00* (2013.01); *C08K 2003/2241* (2013.01); *C08G 77/38* (2013.01); *C09J 183/06* (2013.01); *C08K 5/0025* (2013.01); *H01B 1/22* (2013.01); *H01L 2224/48227* (2013.01); *C09J 9/02* (2013.01)
USPC .......................................... 252/500; 524/588

(58) Field of Classification Search
None
See application file for complete search history.

(56) References Cited

U.S. PATENT DOCUMENTS

| | | | |
|---|---|---|---|
| 7,507,777 B2 * | 3/2009 | Todoroki et al. ............. | 524/588 |
| 2003/0216505 A1 * | 11/2003 | Akiba et al. .................. | 524/588 |
| 2005/0209400 A1 | 9/2005 | Tsumura et al. | |
| 2005/0256241 A1 | 11/2005 | Sachdev et al. | |

FOREIGN PATENT DOCUMENTS

| | | |
|---|---|---|
| CN | 101851478 A | 10/2010 |
| JP | A-04-259766 | 9/1992 |
| JP | A-11-168235 | 6/1999 |
| JP | A-2001-332124 | 11/2001 |
| JP | A-2004-179139 | 6/2004 |
| JP | A-2004-292779 | 10/2004 |
| JP | A-2005-272492 | 10/2005 |
| JP | A-2007-123613 | 5/2007 |
| JP | A-2010-024301 | 2/2010 |
| WO | WO 2010/103998 A1 | 9/2010 |

OTHER PUBLICATIONS

Dec. 11, 2013 European Search Report issued in Application No. 12757068.7.

May 1, 2012 International Search Report issued in International Patent Application No. PCT/JP2012/056520 (with translation).

* cited by examiner

*Primary Examiner* — Harold Pyon
*Assistant Examiner* — Jaison Thomas
(74) *Attorney, Agent, or Firm* — Oliff PLC (57) ABSTRACT

A light-reflective anisotropic conductive adhesive used for anisotropic conductive connection of a light-emitting element to a wiring board includes a thermosetting resin composition containing a silicone resin and a curing agent, conductive particles and light-reflective insulating particles. The light-reflective insulating particle is at least one kind of inorganic particles selected from the group consisting of titanium oxide, boron nitride, zinc oxide, silicon oxide, and aluminum oxide. The silicone resin is a glycidyloxyalkyl-alicyclic alkyl-modified organopolysiloxane.

26 Claims, 4 Drawing Sheets

LIGHT-REFLECTIVE ANISOTROPIC CONDUCTIVE ADHESIVE AND LIGHT-EMITTING DEVICE

TECHNICAL FIELD

The present invention relates to a light-reflective anisotropic conductive adhesive used for anisotropic conductive connection of a light-emitting element to a wiring board, and also relates to a light-emitting device in which a light-emitting element is mounted on a wiring board with the adhesive.

BACKGROUND ART

Figure 3:
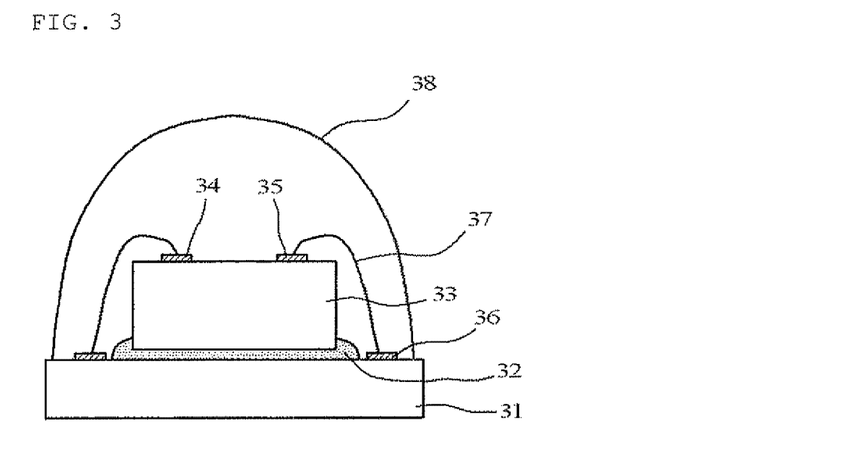
FIG. 3 is a cross-sectional view of a conventional light-emitting device.

Light-emitting devices using light-emitting diode (LED) elements are being widely used. An old-type light-emitting device has a structure shown in FIG. 3. More specifically, an LED element 33 is bonded to a substrate 31 with a die-bonding adhesive 32, and a p electrode 34 and an n electrode 35 on the upper surface of the LED element 33 are wire-bonded to connection terminals 36 of the substrate 31 with gold wires 37. The entire LED element 33 is sealed with a transparent molding resin 38. However, in the light-emitting device shown in FIG. 3, light having a wavelength of 400 to 500 nm and emitted upward from the LED element 33 is absorbed by the gold wires, and part of the light emitted downward is absorbed by the die-bonding adhesive 32. Therefore, there is a problem in that the light emission efficiency of the LED element 33 is reduced.

Figure 4:
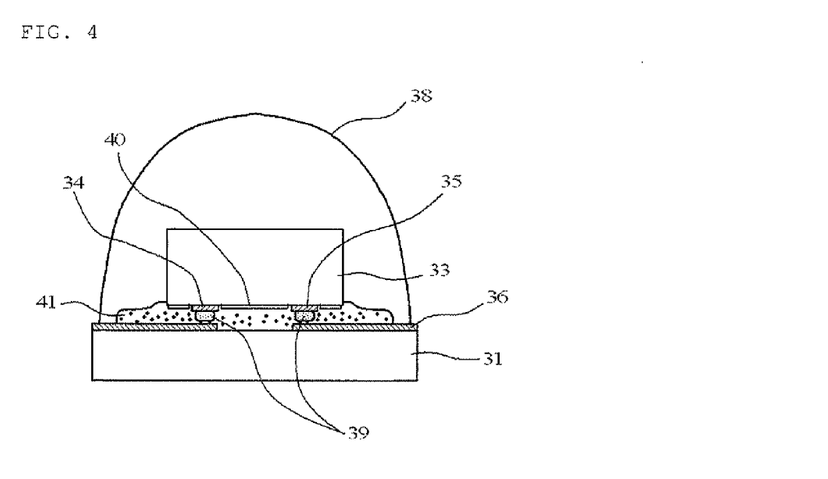
FIG. 4 is a cross-sectional view of another conventional light-emitting device.

For this reason, as shown in FIG. 4, flip-chip mounting of the LED element 33 has been proposed (Patent Literature 1). In this flip-chip mounting technique, bumps 39 are formed on the p electrode 34 and the n electrode 35, respectively, and a light reflecting layer 40 is provided on a bump-forming face of the LED element 33 so that the light reflecting layer 40 is insulated from the p electrode 34 and the n electrode 35. The LED element 33 and the substrate 31 are connected and fixed to each other by curing an anisotropic conductive paste 41 or an anisotropic conductive film (not shown). Therefore, in the light-emitting device in FIG. 4, the light emitted upward from the LED element 33 is not absorbed by the gold wire and almost all the light emitted downward is reflected by the light reflecting layer 40 and is then emitted upward. Thus, the light-emitting efficiency (light extraction efficiency) is not reduced.

Figure 5A:
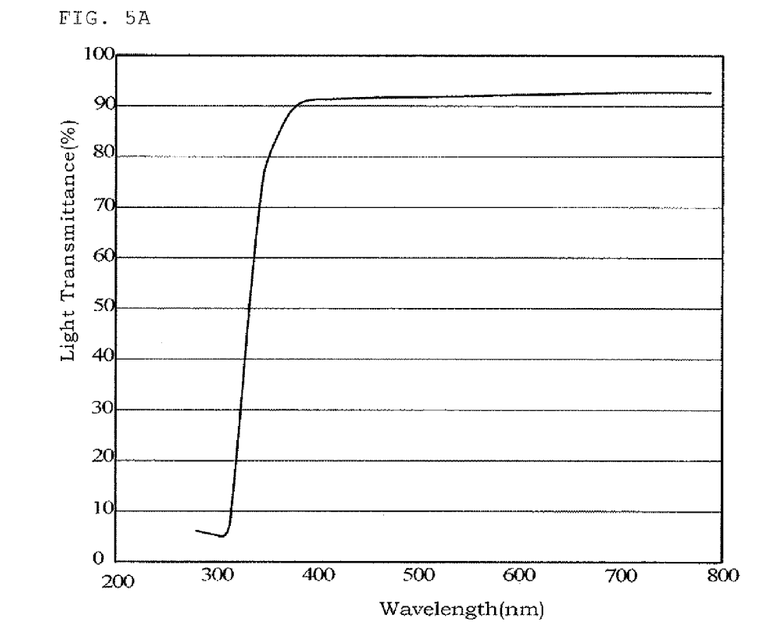
FIG. 5A is a chart showing the light transmittance of an epoxy resin cured product used for the anisotropic conductive adhesive with respect to light wavelengths.
Figure 5B:
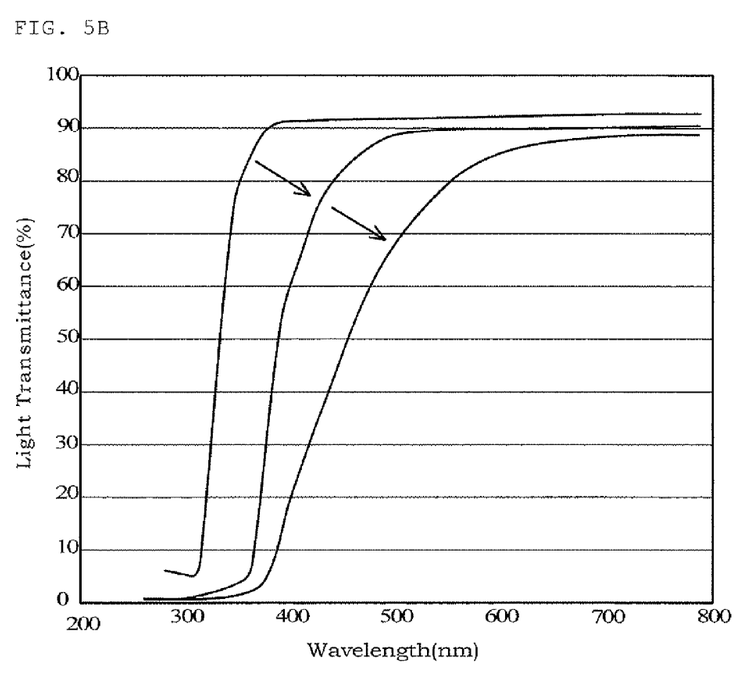
FIG. 5B is a chart showing the light transmittance of the epoxy resin cured product used for the anisotropic conductive adhesive with respect to light wavelengths after heating with UV irradiation.

As a binder resin mixed in an anisotropic conductive paste or an anisotropic conductive film for anisotropic conductive connection of LED to a substrate, an epoxy resin having relatively favorable heat resistance, light stability, and connection reliability has been widely used (Patent Literature 2). However, the epoxy resin can absorb light from the near ultraviolet wavelength region to the near infrared wavelength region due to the molecular structure as shown in FIG. 5A. Further, if heat or light (for example, successive UV irradiation at 120° C.) is applied over a long term, cleavage of a molecular chain or oxidation occurs, and a light transmittance spectrum largely varies as shown in the arrow in FIG. 5B. Therefore, there has been a problem in which the light reflectance and the total luminous flux of LED are significantly reduced due to the long-term use of the light-emitting device. This tendency becomes more remarkable as the power of an LED element is increased and the wavelength thereof is shortened in recent years.

For this reason, a silicone resin having few such defects is attempted to be used in recent years.

CITATION LIST

Patent Literature

[Patent Literature 1] Japanese Patent Application Laid-Open No. Hei. 11-168235
[Patent Literature 2] Japanese Patent Application Laid-Open No. 2010-24301

SUMMARY OF INVENTION

Technical Problem

However, in the technique of Patent Literature 1, the light reflecting layer 40 must be provided on the LED element 33 by a metal vapor deposition method or the like so that the light reflecting layer 40 is insulated from the p electrode 34 and the n electrode 35, and therefore there is a problem in that an increased production cost cannot be avoided.

On the other hand, when the light reflecting layer 40 is not provided, the surfaces of conductive particles covered with gold, nickel, or copper in the cured anisotropic conductive paste or anisotropic conductive film assume a brown or dark brown color. Further, the epoxy resin binder itself in which the conductive particles are dispersed assumes a brown color due to an imidazole-based latent curing agent commonly used to cure the binder. Therefore, there is a problem in that it is difficult to improve the light-emitting efficiency (light extraction efficiency) of the light emitted from the light-emitting element.

In a silicone resin used as a thermosetting resin for the anisotropic conductive paste or the anisotropic conductive film, the light reflectance, the total luminous flux of LED, and the die shear strength are not significantly decreased by the long-term use of the light-emitting device. However, there is a problem of low initial die shear strength itself immediately after anisotropic conductive connection.

It is an object of the present invention to solve the above-described problems in the conventional techniques, and to provide an anisotropic conductive adhesive that, even when a light-emitting diode (LED) element is not provided with a light reflecting layer causing a production cost to increase during production of a light-emitting device in which a light-emitting element such as the LED element is flip-chip mounted on a wiring board with the anisotropic conductive adhesive, can improve the light-emitting efficiency, and that has high initial die shear strength, and wherein the die shear strength and the total luminous flux of LED are not significantly decreased by the long-term use of the light-emitting device. Additionally, it is an object of the present invention to provide a light-emitting device produced by flip-chip mounting a light-emitting element on a wiring board with that adhesive.

Solution to Problems

The present inventors have assumed that, when the anisotropic conductive adhesive itself has a light reflection function, the light-emitting efficiency can be prevented from decreasing, and found that the light-emitting efficiency of a light-emitting element can be prevented from decreasing by mixing light-reflective insulating particles in an anisotropic conductive adhesive. Further, the inventors have found that, when a substance modified with alkenyl glycidyl ether and alkenylcycloalkane is used as a silicone resin to be mixed in the anisotropic conductive adhesive, the initial die shear strength is high, and the light reflectance, the total luminous flux of LED, and the die shear strength are not significantly decreased by the long-term use of a light-emitting device. Then the present invention has been completed.

The present invention provides a light-reflective anisotropic conductive adhesive used for anisotropic conductive connection of a light-emitting element to a wiring board, the light-reflective anisotropic conductive adhesive including a thermosetting resin composition containing a silicone resin and a curing agent, conductive particles, and light-reflective insulating particles, wherein the silicone resin is a glycidyloxyalkyl-alicyclic alkyl-modified organopolysiloxane.

Further, as a particularly preferred aspect of the light-reflective anisotropic conductive adhesive, the present invention provides (a) the light-reflective anisotropic conductive adhesive in which the conductive particle is a light-reflective conductive particle having a core particle coated with a metal material and a light reflecting layer formed from at least one kind of inorganic particles selected from a titanium oxide particle, a boron nitride particle, a zinc oxide particle, a silicon oxide particle, and an aluminum oxide particle on the surface of the core particle, and (b) the light-reflective anisotropic conductive adhesive in which the glycidyloxyalkyl-alicyclic alkyl-modified organopolysiloxane is obtained by hydrosilylation of an alkylhydrogenpolysiloxane with alkenyl glycidyl ether and alkenylcycloalkane, and a curing agent is an acid anhydride-based curing agent.

Furthermore, the present invention provides a light-emitting device obtained by flip-chip mounting a light-emitting element on a wiring board through the above-described light-reflective anisotropic conductive adhesive.

Advantageous Effects of Invention

The light-reflective anisotropic conductive adhesive of the present invention used for anisotropic conductive connection of a light-emitting element to a wiring board contains light-reflective insulating particles. Therefore, the light-reflective anisotropic conductive adhesive can reflect light. In particular, when the light-reflective insulating particle is at least one kind of inorganic particle selected from the group consisting of titanium oxide, boron nitride, zinc oxide, silicate oxide, and aluminum oxide or a resin-coated metal particle in which the surface of a scale-like or spherical metal particle is coated with an insulation resin, the particle itself is almost white. For this reason, the wavelength dependence of light reflective properties to the visible light is low. Therefore, the light-emitting efficiency can be improved, and the light-emitting color of the light-emitting element can be reflected as the original color.

Further, when a light-reflective conductive particle having a core particle coated with a metal material and a white to gray light reflecting layer formed from titanium oxide particles, boron nitride particles, zinc oxide particles, silicon oxide particles, or aluminum oxide particles on the surface thereof is used as the conductive particle, the light-reflective conductive particle itself assumes a white to gray color. For this reason, the wavelength dependence of light reflective properties to the visible light is low. Therefore, the light-emitting efficiency can be further improved, and the light-emitting color of the light-emitting element can be reflected as the original color.

In the light-reflective anisotropic conductive adhesive of the present invention, a glycidyloxyalkyl-alicyclic alkyl-modified organopolysiloxane is used as the silicone resin. Therefore, the initial die shear strength is high, and the light reflectance, the total luminous flux of LED, and the die shear strength are not significantly decreased by the long-term use of the light-emitting device.

DESCRIPTION OF EMBODIMENTS

The light-reflective anisotropic conductive adhesive of the present invention is used for anisotropic conductive connection of a light-emitting element to a wiring board, and is composed of a thermosetting resin composition containing at least a silicone resin and a curing agent, conductive particles, and light-reflective insulating particles. The light-reflective anisotropic conductive adhesive is characterized by containing the light-reflective insulating particle, and using a glycidyloxyalkyl-alicyclic alkyl-modified organopolysiloxane as the silicone resin. The light-reflective insulating particle will be first described.

In the present invention, the light-reflective insulating particle is to reflect light incident on an anisotropic conductive adhesive outward.

A particle having light reflectivity includes a metal particle, a particle coated with metal particles, inorganic particles of metal oxides, metal nitrides, or metal sulfides, which assume a gray to white color under the natural light, a particle formed by coating a resin core particle with inorganic particles, and a particle having a roughness surface regardless of materials of the particle. However, of these particles, a light-reflective insulating particle capable of being used in the present invention does not include the metal particle since insulating property is required. Further, of the metal oxide particles, a particle having conductivity, like ITO, cannot be used. Moreover, an inorganic particle having a refractive index lower than that of the used thermosetting resin composition cannot be used even when exhibiting certain light reflectivity and insulation property.

Specific preferred examples of such a light-reflective insulating particle may include at least one kind of inorganic particles selected from the group consisting of particles of titanium oxide ($TiO_2$), boron nitride (SN), zinc oxide (ZnO), silicon oxide ($SiO_2$), aluminum oxide ($Al_2O_3$). Among these, $TiO_2$ is preferably used from the viewpoint of high refractive index.

The shape of the light-reflective insulating particle may be spherical, scale-like, amorphous, needle-like, and the like. In view of light reflectance, spherical and scale-like shapes are preferable. When the light-reflective insulating particle has a spherical shape and the particle diameter thereof is too small, the light reflectance tends to decrease. When it is too large, anisotropic connection due to the conductive particles tends to be inhibited. Therefore, the particle diameter thereof is preferably 0.02 to 20 µm, and more preferably 0.2 to 1 µm. When the light-reflective insulating particle has a scale-like shape, the longer diameter thereof is preferably 0.1 to 100 µm, and more preferably 1 to 50 µm, the shorter diameter thereof is preferably 0.01 to 10 µm, and more preferably 0.1 to 5 µm, and the thickness thereof is preferably 0.01 to 10 µm, and more preferably 0.1 to 5 µm.

The refractive index according to JIS K7142 of the light-reflective insulating particle comprising the inorganic particle is preferably larger than that of the cured product of the thermosetting resin composition, and more preferably larger by at least about 0.02. This is because when a difference of the refractive index is small, the light reflectance on interfaces is decreased.

As the light-reflective insulating particle, the inorganic particles described above may be used, and a resin-coated metal particle formed by coating the surface of a scale-like or spherical metal particle with a transparent insulating resin may be used. Examples of the metal particle may include nickel, silver, and aluminum. Examples of the shape of the particle may include amorphous, spherical, scale-like, and needle-like shapes. Among these, from the viewpoint of light diffusion effect, a spherical shape is preferable, and from the viewpoint of total reflection effect, a scale-like shape is preferable. From the viewpoint of light reflectance, a scale-like silver particle is especially preferable.

The size of the resin-coated metal particle serving as the light-reflective insulating particle is different according to the shape. However, in general when the size thereof is too large, anisotropic connection due to the conductive particles is likely to be inhibited, and when it is too small, light is difficult to be reflected. Therefore, when the resin-coated metal particle has a spherical shape, the particle diameter thereof is preferably 0.1 to 30 µm, and more preferably 0.2 to 10 µm. When the resin-coated metal particle has a scale-like shape, the longer diameter thereof is preferably 0.1 to 100 µm, and more preferably 1 to 50 µm and the thickness thereof is preferably 0.01 to 10 µm, and more preferably 0.1 to 5 µm. Here, when the particle is covered with an insulating coating, the size of the light-reflective insulating particle is a size including the insulating coating.

As the resin in such a resin-coated metal particle, various insulating resins may be used. From the viewpoint of mechanical strength, transparency, and the like, a cured product of acrylic resin can preferably be used. An acrylic resin formed by radical copolymerization of methyl methacrylate and 2-hydroxyethyl methacrylate in the presence of a radical polymerization initiator such as benzoyl peroxide and other organic peroxides can be more preferably used. In this case, it is further preferable that the resin be cross-linked with an isocyanate-based cross-linking agent such as 2,4-tolylene diisocyanate. In the metal particle constituting the resin-coated metal particle, it is preferable that a γ-glycidoxy group, a vinyl group, and the like, have been introduced onto the surface of the metal in advance with a silane coupling agent.

For example, the resin-coated metal particle can be produced by adding a metal particle and a silane coupling agent to a solvent such as toluene, stirring the mixture at room temperature for about 1 hour, adding a radical monomer, a radical polymerization initiator, and if necessary, a cross-linking agent to the mixture, and stirring the mixture while heating the mixture to an initiating temperature of radical polymerization.

When the mixed amount of the above-described light-reflective insulating particle in the light-reflective anisotropic conductive adhesive is too small, light reflection cannot be sufficiently realized, and when it is too large, connection due to the conductive particles used together is inhibited. Therefore, the amount of the light-reflective insulating particle is preferably 1 to 50% by volume, and more preferably 2 to 25% by volume with respect to the thermosetting resin composition.

As the conductive particle constituting the light-reflective anisotropic conductive adhesive of the present invention, a particle of metal used in the conventional conductive particle for anisotropic conductive connection can be used. Examples of the metal may include gold, nickel, copper, silver, solder, palladium, aluminum, an alloy thereof, and a multi-layered material thereof (for example, nickel plating/gold flash plating material). Since a conductive particle of gold, nickel, or copper among them assumes a brown color, the particle can receive the full benefit of the present invention as compared with the other metal materials. Preferred examples of the size and shape of the metal particle may include a spherical particle having a particle diameter of 0.2 to 5 µm and a flaky particle having a thickness of 0.2 to 0.4 µm and a diameter of 1 to 10 µm.

Further, as the conductive particle, a metal-coated resin particle in which a resin particle is coated with a metal material can be used. Examples of the resin particle constituting such a metal-coated resin particle may include a styrene-based resin particle, a benzoguanamine resin particle, and a nylon resin particle. As a method for coating the resin particle with the metal material, conventionally known methods can be used, and an electroless plating method, an electrolytic plating method, and the like can be used. The thickness of layer of a metal material for coating is enough to ensure favorable connection reliability, and depends on the particle diameter of the resin particle or a kind of metal. It is usually 0.1 to 3 µm.

When the particle diameter of the metal-coated resin particle is too small, poor conductivity is likely to occur, and when it is too large, patterns are likely to be short-circuited. Therefore, it is preferably 1 to 20 µm, more preferably 3 to 10 µm, and particularly preferably 3 to 0.5 µm. In this case, it is preferable that the shape of the metal-coated resin particle be spherical. Further, the shape may be a flaky shape or a rugby ball shape.

Figure 1A:
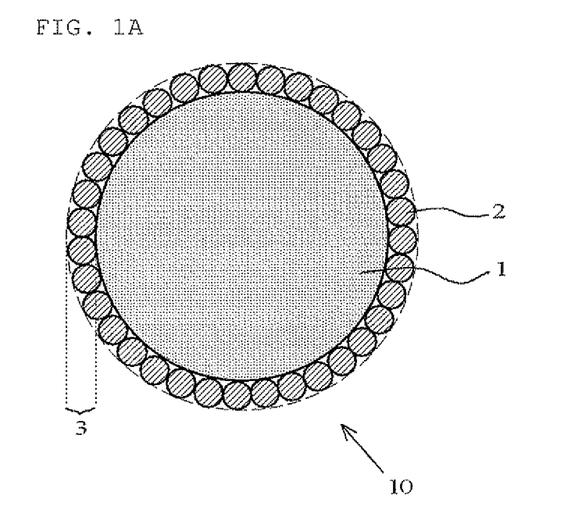
FIG. 1A is a cross-sectional view of a light-reflective conductive particle used for the light-reflective anisotropic conductive adhesive of the present invention.
Figure 1B:
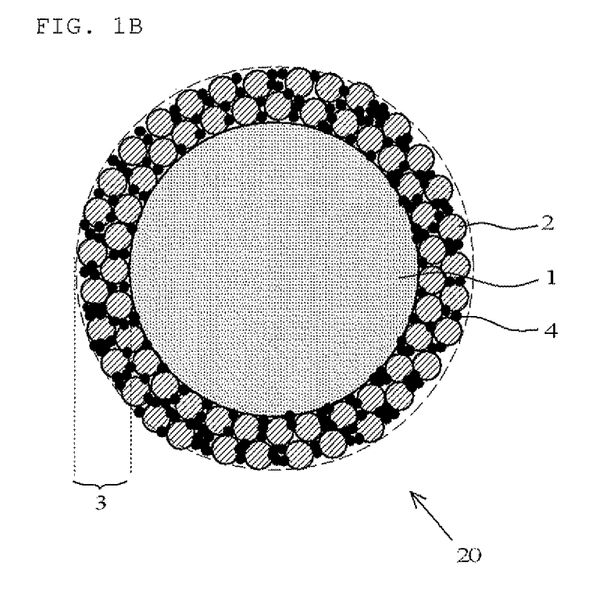
FIG. 1B is a cross-sectional view of a light-reflective conductive particle used for the light-reflective anisotropic conductive adhesive of the present invention.

In the present invention, it is particularly preferable that light reflectivity be imparted to the conductive particle to form a light-reflective conductive particle. FIGS. 1A and 1B are cross-sectional views of light-reflective conductive particles 10 and 20, respectively. The light-reflective conductive particle in FIG. 1A will be described.

The light-reflective conductive particle 10 is composed of a core particle 1 coated with a metal material and a light reflecting layer 3 formed on the surface of the core particle from at least one kind of inorganic particles 2 selected from the group consisting of titanium oxide ($TiO_2$), boron nitride (BN), zinc oxide (ZnO), silicon oxide ($SiO_2$), and aluminum oxide ($Al_2O_3$). Titanium oxide particles, boron nitride particles, zinc oxide particles, silicon oxide particles, and aluminum oxide particles are inorganic particles assuming a white color under the sun light. The light reflecting layer 3 made from the particles assumes a white to gray color. The white to gray color of the light reflecting layer means that the wavelength dependency of light reflective properties to the visible light is low and the visible light is likely to be reflected.

When photodegeneration of the cured product of the thermosetting resin composition of the cured light-reflective anisotropic conductive adhesive is concerned, among the titanium oxide particle, the boron nitride particle, the zinc oxide particle, the silicon oxide particle, and the aluminum oxide particle, the zinc oxide particle having no catalytic property with respective to the photodegeneration and high refractive index can be preferably used.

Since the core particle 1 is subjected to anisotropic conductive connection, the surface of the core particle is made from a metal material. As an aspect of a surface coated with the metal material, an aspect in which the core particle 1 itself is the metal material as described above, and an aspect in which the surface of a resin particle is coated with the metal material may be exemplified.

From the viewpoint of size relative to the particle diameter of the core particle 1, when the thickness of the light reflecting layer 3 made from the inorganic particles 2 is too small as compared with the particle diameter of the core particle 1, the light reflectance significantly decreases, and when it is too large, poor conductivity occurs. Therefore, the thickness is preferably 0.5 to 50%, and more preferably 1 to 25%.

When the particle diameter of the inorganic particles 2 constituting the light reflecting layer 3 in the light-reflective conductive particle 10 is too small, a light reflection phenomenon is unlikely to occur, and when it is too large, formation of the light reflecting layer tends to be difficult. Therefore, the particle diameter thereof is preferably 0.02 to 4 μm, more preferably 0.1 to 1 μm, and particularly preferably 0.2 to 0.5 μm. In this case, from the viewpoint of wavelength of light to be reflected, it is preferable that the particle diameter of the inorganic particles 2 be equal to or more than 50% of wavelength of the light to be reflected (that is, the light emitted by the light-emitting device) so that the light to be reflected does not penetrate. Further, examples of the shape of the inorganic particles 2 may include amorphous, spherical, scale-like, and needle-like shapes. Among these, from the viewpoint of light diffusion effect, a spherical shape is preferable, and from the viewpoint of total reflection effect, a scale-like shape is preferable.

The light-reflective conductive particle 10 in FIG. 1A can be produced by the known film formation technique (so-called mechano-fusion method) in which powders of various sizes are caused to physically collide with each other to form a film made from particles having a smaller particle diameter on the surface of particles having a larger particle diameter. In this case, the inorganic particles 2 are fixed to the metal material on the surface of the core particle 1 to enter into the metal material. Further, the inorganic particles 2 are difficult to be fixed by fusion, and therefore a monolayer of the inorganic particles 2 constitutes the light reflecting layer 3. In FIG. 1A, the thickness of the light reflecting layer 3 may be equal to or slightly less than the particle diameter of the inorganic particles 2.

The light-reflective conductive particle 20 in FIG. 1B will now be described. The light-reflective conductive particle 20 is different from the light-reflective conductive particle 10 in FIG. 1A in that a light reflecting layer 3 contains a thermoplastic resin 4 functioning as an adhesive, inorganic particles 2 are fixed by the thermoplastic resin 4, and multi-layers (for example, two layers or three layers) of the inorganic particles 2 are formed. The presence of the thermoplastic resin 4 improves mechanical strength of the light reflecting layer 3, and therefore the inorganic particles 2 are difficult to be separated.

As the thermoplastic resin 4, a halogen-free thermoplastic resin can be preferably used with the intention to reduce the load on the environment. For example, polyolefin such as polyethylene and polypropylene, polystyrene, an acrylic resin, and the like, can be preferably used.

Such a light-reflective conductive particle 20 can also be produced by the mechano-fusion method. When the particle diameter of the thermoplastic resin 4 applicable to the mechano-fusion method is too small, adhesion function deteriorates, and when it is too large, the thermoplastic resin 4 is difficult to adhere to the core particle 1. Therefore, the particle diameter thereof is preferably 0.02 to 4 μm, and more preferably 0.1 to 1 μm. Further, when the mixed amount of the thermoplastic resin 4 is too small, the adhesion function deteriorates, and when it is too large, agglomerates of the particles are formed. Therefore, the mixed amount is preferably 0.2 to 500 parts by mass, and more preferably 4 to 25 parts by mass with respect to 100 parts by mass of the inorganic particle 2.

As the thermosetting resin composition used for the light-reflective anisotropic conductive adhesive of the present invention, a colorless and transparent material is preferably used as far as possible. This is because the light reflectance of the light-reflective conductive particle in the light-reflective anisotropic conductive adhesive does not decrease, and the incident light is reflected without the color of the incident light being changed. The colorless and transparent used herein means that a cured product of the thermosetting resin composition has a light transmittance according to JIS K7105 of light path length of 1 cm of 80% or more, and preferably 90% or more, with respect to the visible light having a wavelength of 380 to 780 nm.

In the light-reflective anisotropic conductive adhesive of the present invention, when the mixed amount (% by volume) of the conductive particle such as a light-reflective conductive particle with respect to the thermosetting resin composition is too small, poor conductivity occurs, and when it is too large, patterns are likely to be short-circuited. Therefore, the mixed amount thereof is preferably 5 to 30% by volume, and more preferably 10 to 20% by volume.

In the light reflective property of the light-reflective anisotropic conductive adhesive of the present invention, it is desirable that the cured product of the light-reflective anisotropic conductive adhesive have a reflectance according to JIS K7105 to the light having a wavelength of 450 nm of at least 30% to improve the light-emitting efficiency of the light-emitting element. In order to obtain such a light reflectance, the light reflective property and the mixed amount of the used light-reflective conductive particle, the mixed composition of the thermosetting resin composition, and the like, may be appropriately adjusted. In general, increase of the mixed amount of the light-reflective conductive particle having a favorable light reflective property tends to increase the light reflectance.

Further, from the viewpoint of refractive index, the light reflective property of the light-reflective anisotropic conductive adhesive can be evaluated. This is because when the refractive index of the cured product is larger than the refractive index of the cured product of the thermosetting resin composition excluding the conductive particles and the light-reflective insulating particles, the light reflection amount on the interface between the light-reflective insulating particles and the cured product of the thermosetting resin composition surrounding the particles increases. Specifically, it is desirable that a difference subtracting the refractive index according to JIS K7142 of the cured product of the thermosetting resin composition from that of the light-reflective insulating particle be preferably 0.02 or more, and more preferably 0.2 or more. A cured product of a thermosetting resin composition containing a silicone resin as a main component has usually a refractive index of about 1.40 to 1.55.

The thermosetting resin composition constituting the light-reflective anisotropic conductive adhesive of the present invention contains the glycidyloxyalkyl-alicyclic alkyl-modified organopolysiloxane. The glycidyloxyalkyl-alicyclic alkyl-modified organopolysiloxane is obtained by hydrosilylation of an alkylhydrogenpolysiloxane with alkenyl glycidyl ether and alkenyl cycloalkane.

The alkylhydrogenpolysiloxane is a compound for introducing an epoxy group into a side chain of the polysiloxane by hydrosilylation. Since the polysiloxane has a polar group on the surface of the molecule by introduction of the epoxy group, adhesion to an adherend of the light-reflective anisotropic conductive adhesive can be enhanced. Further, the alkylhydrogenpolysiloxane can be heat-cured by an acid anhydride-based curing agent.

In view of handling property, the weight average molecular weight of the alkylhydrogenpolysiloxane is preferably 70000 or lower. The lower limit thereof is 300 or larger in terms of limitations of production.

Specific preferred examples of the alkylhydrogenpolysiloxane may include alkylhydrogenpolysiloxanes in which the alkyl group is a methyl group, an ethyl group, a propyl group, an isopropyl group, a butyl group, a t-butyl group, an isobutyl group, or the like. Among the alkylhydrogenpolysiloxanes, an alkylhydrogenpolysiloxane in which the alkyl group is a methyl group is preferable. The chemical structure of methylhydrogenpolysiloxane is represented by the formula (1).

(1)

In the formula (1), when m is a too small number, there are not enough hydrogensilyl groups, and therefore cross-linking cannot be sufficiently formed. As a result, the die shear strength tends to decrease. When m is a too large number, the hydrogensilyl group becomes excessive, it is difficult to complete hydrosilylation, and therefore too many hydrogensilyl groups tend to remain. Accordingly, m is preferably a number of 3 to 40, more preferably 8 to 35, and particularly preferably 10 to 30. As seen from the relation between m and n as described below, when n is a too small number, m also becomes a small number relatively. As a result, the hydrogensilyl groups tend to be insufficient. When n is a too large number, m also becomes a large number relatively. As a result, the hydrogensilyl groups tend to be excessive. Accordingly, n is preferably a number of 3 to 40, more preferably 10 to 35, and particularly preferably 15 to 28.

The relation between m and n in the formula (I) is preferably m<n, and more preferably 2 m<n. This is because when the methylhydrogensilyl group exists more than the dimethylsilyl group, hydrosilylation of the hydrogensilyl group adjacent to the glycidyloxyalkyl group is difficult due to steric hindrance during hydrosilylation of the hydrogensilyl group with alkenyl glycidyl ether. Therefore, it is desirable that two or more successive methylhydrogensilyl groups do not exist.

The alkenyl glycidyl ether is a compound for introducing a glycidyloxyalkyl group having an epoxy group into a side chain of the polysiloxane by hydrosilylation. Examples of the alkenyl group may include a vinyl group, an allyl group, and a 1-propenyl group. Among them, from the viewpoint of high reactivity, an allyl group is preferable.

Further, the alkenylcycloalkane is a compound for introducing an alicyclic alkyl group into the side chain of the polysiloxane by hydrosilylation, and for imparting favorable transparency to the thermosetting resin composition. The hardness of the thermosetting resin composition can be adjusted by selecting the kind of cycloalkane or adjusting the amount thereof. When the hardness is too low, there is a concern that stress is applied to the light-emitting element due to deformation of the resin during a process of producing a light-emitting device or use of an assembled light-emitting device, causing the light-emitting device to break down.

Examples of the alkenyl group of the alkenylcycloalkane may include a vinyl group, an allyl group, and a 1-propenyl group. Among them, from the viewpoint of high reactivity, a vinyl group is preferable. Further, examples of the cycloalkane may include cyclobutane, cyclopentane, and cyclohexane. Among them, from the viewpoint of skeleton having resistance to heat and light, cyclohexane is preferable.

With regard to the used amounts of alkenyl glycidyl ether, and preferably allyl glycidyl ether, and alkenylcycloalkane, and preferably vinylcyclohexane in the hydrosilylation, when the amount of the former is too large, an unreacted part of the former remains in the free state in the light-reflective anisotropic conductive adhesive, and therefore the resistance to heat and light of the light-reflective anisotropic conductive adhesive tends to decrease. When the amount of the former is too small, properties such as die shear strength and hardness of the cured product of the light-reflective anisotropic conductive adhesive tend to decrease. Accordingly, the amount of alkenylcycloalkane is preferably 0.3 to 2 mol, and more preferably 0.5 to 1.2 mol with respect to 1 mol of alkenyl glycidyl ether.

With regard to the total used amount of the alkenyl glycidyl ether and alkenylcycloalkane in the hydrosilylation with respect to the amount of alkylhydrogenpolysiloxane, when the amount of the former is too small, an unreacted part of the former remains in the free state in ACF, and therefore heat resistant decrease. When it is too large, properties such as die shear strength of the cured product tend to decrease. Accordingly, the total amount of alkenyl glycidyl ether and alkenylcycloalkane is preferably 0.7 to 1.3 equivalents, and more preferably 0.9 to 1.1 equivalents with respect to 1 equivalent of alkylhydrogenpolysiloxane (based on a hydrogensilyl group).

The reaction conditions of the conventionally known hydrosilylation can be applied to the hydrosilylation. For example, the hydrosilylation catalyst to be used can appropriately be selected from hexachloro platinum, a platinum-divinyltetramethyldisiloxane complex, platinum divinyl siloxane, platinum cyclic vinyl methylsiloxane, tris(dibenzylideneacetone)diplatinum, chloroplatinic acid, bis(ethylene)tetrachloro diplatinum, cyclooctadiene dichloroplatinum, bis(dimethylphenylphosphine)dichloroplatinum, tetrakis(triphenylphosphine)platinum, and platinum carbon.

The thermosetting resin composition used in the present invention contains a curing agent for curing a glycidyloxyalkyl-alicyclic alkyl-modified organopolysiloxane. Examples of the curing agent may include an acid anhydride-based curing agent for curing an epoxy resin, an imidazole compound, and dicyan. Among them, it is preferable that the curing agent be an acid anhydride-based curing agent which is difficult to change the color of the cured product, and particularly an acid anhydride-based curing agent having no double bond in the molecule. Specific examples thereof may include methylhexahydrophthalic anhydride, and methyltetrahydrophthalic anhydride.

The mixed amount of the curing agent in the thermosetting resin composition is different according to a curing mechanism. However, in the mechanism of addition reaction using the acid anhydride-based curing agent, when the mixed amount is too small or too large, properties such as the heat and light properties and the die shear strength of the cured product tend to decrease. Therefore, the mixed amount of the curing agent is preferably 50 to 140 parts by mass, and more preferably 80 to 120 parts by mass with respect to 100 parts by mass of the glycidyloxyalkyl-alicyclic alkyl-modified organopolysiloxane.

The thermosetting resin composition constituting the light-reflective anisotropic conductive adhesive of the present invention may contain various anti-age agents such as a hindered phenol, an aromatic amine, a hydroperoxide, a metal deactivator, and a UV screening agent.

The known epoxy resin and silicone resin can be added to the light-reflective anisotropic conductive adhesive of the present invention within a range not impairing the effects of the present invention. Examples of the silicone resin may include dimethyl polysiloxane, and diphenyl polysiloxane. Examples of the epoxy resin may include an alicyclic epoxy compound, a heterocyclic epoxy compound, and a hydrogenated epoxy compound.

Preferred examples of the alicyclic epoxy compound may include compounds having two or more epoxy groups in their molecules. These may be liquid or solid. Specific examples thereof may include glycidyl hexahydrobisphenol A, and 3,4-epoxycyclohexenylmethyl-3',4'-epoxycyclohexene carboxylate. Among these, from the viewpoint of the fact that the cured product can secure the light transmissivity suitable to packaging of an LED element and rapid curing properties are excellent, 3,4-epoxycyclohexenylmethyl-3',4'-epoxycyclohexene carboxylate having an epoxy resin in the ring can be preferably used.

Examples of the heterocyclic epoxy compound may include epoxy compounds having a triazine ring. Particularly preferred examples thereof may include 1,3,5-tris(2,3-epoxypropyl)-1,3,5-triazine-2,4,6-(1H,3H,5H)-trione.

As the hydrogenated epoxy compound, hydrogenated compounds of the alicyclic epoxy compound and the heterocyclic epoxy compound, and another known hydrogenated epoxy resin can be used.

The alicyclic epoxy compound, the heterocyclic epoxy compound, and the hydrogenated epoxy compound may be used alone, or two or more kinds thereof may be used in combination. Another epoxy compound may be used in combination with these epoxy compounds as long as the effects of the present invention are not adversely affected. Examples thereof may include glycidyl ethers obtained by reacting epichlorohydrin with a polyhydric phenol such as, bisphenol A, bisphenol F, bisphenol S, tetramethylbisphenol A, diaryl-bisphenol A, hydroquinone, catechol, resorcin, cresol, tetrabromobisphenol A, trihydroxybiphenyl, benzophenone, bis-resorcinol, bisphenol hexafluoroacetone, tetramethylbisphenol A, tetramethylbisphenol F, tris(hydroxyphenyl)methane, bixylenol, phenol-novolac, and cresol novolac; polyglycidyl ethers obtained by reacting epichlorohydrin with an aliphatic polyhydric alcohol such as glycerol, neopentyl glycol, ethylene glycol, propylene glycol, butylene glycol, hexylene glycol, polyethylene glycol, and polypropylene glycol; glycidyl ether esters obtained by reacting epichlorohydrin with a hydroxycarboxylic acid such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acids; glycidylaminoglycidyl ethers obtained from aminophenol and aminoalkylphenol; glycidylaminoglycidyl esters obtained from aminobenzoic acids; glycidylamines obtained from aniline, toluidine, tribromoaniline, xylylenediamine, diamino cyclohexane, bisaminomethylcyclohexane, 4,4'-diaminodiphenylmethane, 4,4'-diaminodiphenylsulfone, and the like; and known epoxy resins such as epoxidized polyolefins.

The light-reflective anisotropic conductive adhesive of the present invention can be produced by uniformly mixing the light-reflective insulating particles, the conductive particles, and the thermosetting resin composition. Further, when a light-reflective anisotropic conductive film is formed, they are dispersed and mixed in a solvent such as toluene, and the resultant mixture may be applied to a peeled PET film so as to have a desired thickness, and dried at about 80° C.

Figure 2:
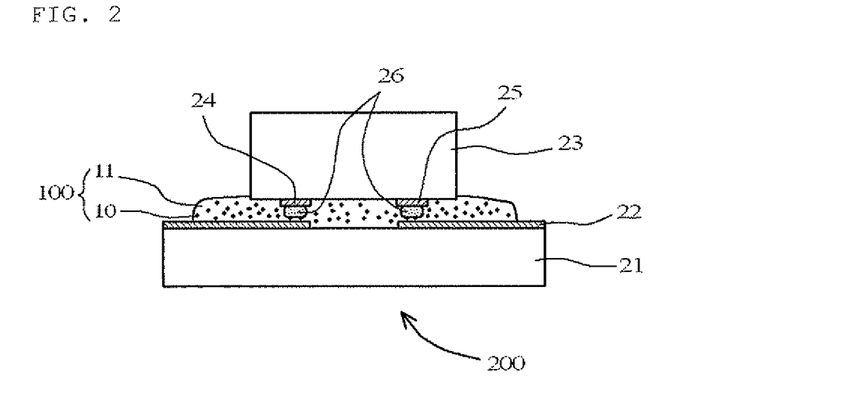
FIG. 2 is a cross-sectional view of the light-emitting device of the present invention.

Next, the light-emitting device of the present invention will be described with reference to FIG. 2. A light-emitting device 200 is formed by flip-chip mounting a substrate 21 and an LED element 23, with the light-reflective anisotropic conductive adhesive of the present invention applied between a connection terminal 22 on the substrate 21 and connection bumps 26 respectively formed on an n electrode 24 and a p electrode 25 of the LED element 23 which is a light-emitting element. Here, a cured product 100 of the light-reflective anisotropic conductive adhesive is a cured product 11 of the thermosetting resin composition in which light-reflective conductive particles 10 are dispersed. Optionally, the entire LED element 23 may be sealed with a transparent mold resin. In addition, a light reflecting layer may be provided on the LED element 23 as in a conventional device.

In the thus-configured light-emitting device 200, of the light emitted by the LED element 23, the light emitted toward the substrate 21 side is reflected by the light-reflective conductive particles 10 in the cured product 100 of the light-reflective anisotropic conductive adhesive, and is output from the upper face of the LED element 23. Therefore, decrease of the light-emitting efficiency can be prevented.

The parts (LED element 23, bumps 26, substrate 21, connection terminals 22, and the like) other than the light-reflective anisotropic conductive adhesive in the light-emitting device 200 of the present invention may be configured in the same manner as in a conventional light-emitting device. Further, the light-emitting device 200 of the present invention can be produced by the conventional anisotropic conductive connection technique except for use of the light-reflective anisotropic conductive adhesive of the present invention. As the light-emitting element, the LED element and the known light-emitting element can be used within a range not impairing the effects of the present invention.

EXAMPLES

Reference Example

Preparation of Glycidyloxypropyl-Cyclohexylethyl-Modified Methylpolysiloxane (Hereinafter Sometimes Simply Referred to as Epoxy-Modified Polysiloxane)

One gram of allyl glycidyl ether (allyl glycidyl ether-S, Yokkaichi Chemical Company Limited) and 1 g of vinylcyclohexane (Acros Organics) were weighed and added to 3 g of toluene and dissolved. To the toluene solution, a methylhydrogensiloxane-dimethylsiloxane copolymer (HMS-082, Gelest, Inc.) was added dropwise so that the equivalent ratio of methylhydrogensiloxane-dimethylsiloxane copolymer/allyl glycidyl ether/vinylcyclohexane was 1/0.5/0.5, to obtain a reaction solution.

To 3 g of the reaction solution, one drop (0.0145 g) of catalytic solution obtained by dissolving 0.0742 g of platinum-divinyltetramethyldisiloxane complex in 1.804 g of isopropyl alcohol was added and mixed. The mixture was stirred in a jar mill at 60° C. for 3 hours. After the stirring, toluene was removed using a rotary evaporator, to obtain a glycidyloxypropyl-cyclohexylethyl-modified methylpolysiloxane.

When the resulting epoxy-modified polysiloxane was subjected to an FT-IR measurement, it was confirmed that the peak of a Si—H stretching near 2200 $cm^{-1}$ was disappeared.

Examples 1 to 7 and Comparative Examples 1 to 4

Thermosetting resin compositions were prepared by uniformly mixing components other than a conductive particle and a light-reflective insulating particle in mixed amounts (part by mass) shown in Table 1 with a general desktop stirrer. To the thermosetting resin compositions, 10 phr (parts per hundred resin) of Au particles and 30 phr of light-reflective insulating particles were added, and the mixture was uniformly mixed with the desktop stirrer to obtain white light-reflective anisotropic conductive adhesives.

Example 6 is an example using a titanium oxide-coated silver particle prepared as described below as the light-reflective insulating particle. Example 7 is an example using a titanium oxide-coated gold particle as the light-reflective conductive particle. Comparative Example 1 is an example of a light-reflective anisotropic conductive adhesive using an alicyclic epoxy resin instead of a silicone resin. Comparative Examples 2 and 3 are examples of light-reflective anisotropic conductive adhesives using commercially available unmodified silicone resins. Comparative Example 4 is an example without a light-reflective insulating particle.

(Titanium Oxide-Coated Silver Particle Used in Example 6 (Light-Reflecting Insulating Particle))

In a flask equipped with a stirrer, 5 g of granular silver particles (average particle diameter: 1.0 μm) and 50 ml of toluene were placed, 0.25 g of silane coupling agent (3-methacryloxypropyltriethoxysilane) was added with stirring, and the resultant mixture was stirred at 25° C. for 60 minutes. Next, 2 g of methyl methacrylate, 2 g of 2-hydroxyethyl methacrylate, 0.04 g of benzoyl peroxide, and 1 g of 2,4-tolylene diisocyanate were added to the mixture. The resultant mixture was stirred at 80° C. for 12 hours to obtain silver particles having an insulating coating as a light-reflecting insulating particle. The average particle diameter of light-reflective insulating particles including the insulating coating was 5.0 μm.

(Titanium Oxide-Coated Gold Particle Used in Example 7 (Light-Reflecting Insulating Particle))

A titanium oxide powder having an average particle diameter of 0.5 μm and brown Au-coated resin conductive particles having an average particle diameter of 5 μm (which were particles formed by coating spherical acrylic resin particles having an average particle diameter of 4.6 μm with an electroless gold plating having a thickness of 0.2 μm) were placed in a mechano-fusion device, and a light reflecting layer of titanium oxide particles having a thickness of about 0.5 μm was formed on the surface of the conductive particles to obtain light-reflective conductive particles. The appearance color of the light-reflective conductive particles was gray.

EVALUATION

The resulting light-reflective anisotropic conductive adhesives were each subjected to measurements of light reflectance, total luminous flux, and die shear strength, and a continuity light-emitting check test, as described below.

1) Light Reflectance Measurement

The light-reflective anisotropic conductive adhesive was applied to a white ceramic board, and heated at 200° C. for 30 seconds to obtain a cured product having a thickness of 1 mm. The cured product was cut into a 1-cm cube, which was used as a sample for light reflectance measurement. The sample was left in an oven at 150° C. for 1000 hours. The reflectance according to JIS K7150 of the sample before (at the initial stage) and after the leaving (after aging) with respect to light having a wavelength of 450 nm was measured with a spectrophotometer (U3300, Hitachi, Ltd.). The obtained results are shown in Table 1. It is desirable that the light reflectance be 30% or more in practical terms and the decrease rate of the light reflectance before and after aging be 20% or less.

2) Total Luminous Flux Measurement

An Au-bump having a height of 15 μm was formed on a glass epoxy substrate having wirings in which copper wirings having a pitch of 100 μm had been Ni/Au plated (5.0 μm/0.3 μm in thickness) with a bump bonder (FB700, Kaijo Corporation). A blue LED (Vf=3.2 (If=20 mA)) was flip-chip mounted on the glass epoxy substrate with the Au bump using the light-reflective anisotropic conductive adhesive under conditions of 200° C., 30 seconds, and 100 gf/chip, to obtain an LED module for tests. The LED module for tests was made to emit light under environment of 85° C. and 85% RH for 1000 hours, and the total luminous fluxes at the initial stage of light-emission and after 1000-hour light-emission (after aging) were measured with a total luminous flux measurement system (integrating sphere type) (LE-2100, Otsuka Electronics Co., Ltd.) (measurement condition: If=20 mA (constant-current control)). The obtained results are shown in Table 1. It is desirable that the total luminous flux at the initial stage be 250 mlm or more in practical terms. Further, it is desirable that the decrease rate of the total luminous flux before and after aging be 15% or less.

3) Die Shear Strength Measurement

The same LED module for tests as used in the total luminous flux measurement was produced again, and made to emit light under environment of 85° C. and 85% RH for 1000 hours (If=20 mA (constant-current control)). The die shear strength of the light-reflective anisotropic conductive adhesive at the initial stage of light-emission and after 1000-hour light-emission (after aging) was measured with a die shear strength tester (PTR-1100, Rhesca Corporation) at a shear rate of 20 μm/sec. The obtained results are shown in Table 1. It is desirable that the die shear strength be 70 N/chip or more in practical terms. Further, it is desirable that the decrease rate of the die shear strength before and after aging be 10% or less.

4) Continuity Light-Emitting Check Test

The same LED module for tests as used in the total luminous flux measurement was produced again, and made to emit light under environment of 85° C. and 85% RH for 3000 hours (If=20 mA (constant-current control)). At the initial stage of light-emission and after 3000-hour light-emission (after aging), the occurrence of abnormality (poor continuity, etc.) was visually observed. A case in which the abnormality did not occur was evaluated as "OK", while a case in which the abnormality occurred was evaluated as "NG". The obtained results are shown in Table 1.

is found that the light-reflective anisotropic conductive adhesives are impractical. In the light-reflective anisotropic conductive adhesives without a light-reflective insulating particle

TABLE 1

| Light-Reflective Anisotropic Conductive Adhesive | | Example 1 | 2 | 3 | 4 | 5 | 6 | 7 | Comparative Example 1 | 2 | 3 | 4 |
|---|---|---|---|---|---|---|---|---|---|---|---|---|
| Epoxy-Modified Polysiloxane (part by mass) | Prepared In Reference Example | 49 | 49 | 49 | 49 | 24 | 49 | 49 | | | | 49 |
| Alicyclic Epoxy Resin *1 (part by mass) | Celloxide 2021P, Daicel Corporation | | | | | 24 | | | 49 | | | |
| Methylsilicone Resin (part by mass) | KER 3000, Shin-Etsu Chemical Co., Ltd. | | | | | | | | | 100 | | |
| Phenylsilicone Resin (part by mass) | KER 6100, Shin-Etsu Chemical Co., Ltd. | | | | | | | | | | 100 | |
| Acid Anhydride-Based Curing Agent *2 (part by mass) | MH700, New Japan Chemical Co., Ltd. | 49 | 49 | 49 | 49 | 49 | 49 | 49 | 49 | | | 49 |
| Hardening Accelerator *3 (part by mass) | TPP-K, Hokko Chemical Industry Co., Ltd. | 1 | 1 | 1 | 1 | 1 | 1 | 1 | 1 | | | 1 |
| Anti-Aging Agent *4 (part by mass) | AO-60, ADEKA Corporation | 1 | 1 | 1 | 1 | 1 | 1 | 1 | 1 | | | 1 |
| Conductive Particle (phr) | Au Particle *5 | 10 | 10 | 10 | 10 | 10 | 10 | | 10 | 10 | 10 | 10 |
| | TiO$_2$-Coated Au Particle | | | | | | | 10 | | | | |
| Light-Reflecting Insulating Particle (phr) | Titanium Oxide *6 | 30 | | | 30 | 30 | | | 30 | 30 | 30 | |
| | Zinc Oxide *7 | | 30 | 30 | | | | | | | | |
| | Silicon Oxide *8 | | | 30 | | | | | | | | |
| | TiO$_2$-Coated Ag Particle | | | | | | 30 | 57 | | | | |
| 1) Light Reflectance (%) | Initial Stage | 80 | 71 | 55 | 80 | 80 | 75 | 57 | 80 | 80 | 80 | 15 |
| | After 1000-Hour Aging | 77 | 68 | 51 | 75 | 69 | 71 | 55 | 50 | 80 | 75 | 13 |
| | Decrease Rate (%) | 3.8 | 4.2 | 7.3 | 6.3 | 13.8 | 5.3 | 3.5 | 37.5 | 0 | 6.3 | 13.3 |
| 2) Total Luminous Flux (mlm) | Initial Stage | 400 | 350 | 250 | 400 | 400 | 400 | 250 | 400 | 400 | 400 | 90 |
| | After 1000-Hour Aging | 390 | 340 | 240 | 370 | 320 | 350 | 240 | 300 | 400 | 390 | 77 |
| | Decrease Rate (%) | 2.5 | 2.9 | 4.0 | 7.5 | 20.0 | 12.5 | 4.0 | 25.0 | 0 | 2.5 | 14.4 |
| 3) Die Shear Strength (N/chip) | Initial Stage | 82 | 82 | 82 | 82 | 82 | 82 | 82 | 82 | 10 | 15 | 82 |
| | After 1000-Hour Aging | 76 | 76 | 76 | 76 | 76 | 76 | 76 | 76 | 10 | 10 | 76 |
| | Decrease Rate (%) | 7.3 | 7.3 | 7.3 | 7.3 | 7.3 | 7.3 | 7.3 | 7.3 | 0 | 33.3 | 7.3 |
| 4) Continuity Light-Emitting Check | Initial Stage | OK | OK | OK | OK | OK | OK | OK | OK | OK | OK | OK |
| | After 3000-Hour Aging | OK | OK | OK | OK | OK | OK | OK | NG | NG | NG | NG |

*1: 3,4-epoxycyclohexenylmethyl-3',4'-epoxycyclohexene carboxylate
*2: methylhexahydrophthalic anhydride
*3: tetraphenylphosphonium tetraphenylborate
*4: alicyclic epoxy hindered phenol-containing anti-aging agent
*5: particle formed by coating spherical acrylic resin particles having an average particle diameter of 4.6 μm with an electroless gold plating having a thickness of 0.2 μm (Bright20GN4.6EH, Nippon Chemical Industrial Co., Ltd.)
*6: titanium dioxide powder having an average particle diameter of 0.5 μm (KR-380, Titan Kogyo, Ltd.)
*7: zinc oxide powder having an average particle diameter of 0.5 μm (JIS Standard Zinc Oxide JIS1, Hakusuitech Ltd.)
*8: silicon oxide powder having an average particle diameter of 0.05 μm (OX50, Nippon Aerosil Co., Ltd.)

As shown in Table 1, in the light-reflective anisotropic conductive adhesives containing light-reflective insulating particles in Examples 1 to 7, the light reflectances were 30% or more, the decrease rates thereof before and after aging were 20% or less, and blue light of 450 nm was reflected as the original color. Further, the total luminous fluxes at the initial stage were 250 mlm or more, and the decrease rates thereof before and after aging were 15% or less. Moreover, the die shear strengths were 70 N/chip or more, and the decrease rates thereof before and after aging were 10% or less. In the continuity light-emitting check test, abnormalities were not recognized.

On the other hand, in Comparative Example 1 in which the general unmodified alicyclic epoxy resin was used, the light reflectance and the total luminous flux remarkably decreased before and after aging, and the result of the continuity light-emitting check test after aging was evaluated as NG. Therefore, it is found that the light-reflective anisotropic conductive adhesive is impractical. In Comparative Examples 2 and 3 using general silicone resins, the die shear strength was remarkably low, and the results of the continuity light-emitting check test after aging were evaluated as NG. Therefore, it is found that the light-reflective anisotropic conductive adhesives are impractical. In the light-reflective anisotropic conductive adhesives without a light-reflective insulating particle in Comparative Example 4, each initial result of the total luminous flux and the light reflectance did not meet a practical level.

INDUSTRIAL APPLICABILITY

When a light-emitting device is produced by flip-chip mounting a light-emitting element such as a light-emitting diode (LED) element on a wiring board with an anisotropic conductive adhesive, even if the light-emitting element is not provided with a light reflecting layer which causes costs to increase, the light-reflective anisotropic conductive adhesive of the present invention can prevent the light-emitting efficiency from being decreased. Further, since glycidyloxyalkyl-alicyclic alkyl-modified organopolysiloxane is used as the curing component of the thermosetting resin composition, the initial die shear strength is high, and the die shear strength and the total luminous flux of LED are not significantly decreased by the long-term use of the light-emitting device. Therefore, the light-reflective anisotropic conductive adhesive of the present invention is useful in flip-chip mounting of an LED element.

REFERENCE SIGNS LIST 1 core particle
2 inorganic particle
3 light reflecting layer
4 thermoplastic resin
10, 20 light-reflective conductive particle
11 cured product of thermosetting resin composition
21 substrate
22 connection terminal
23 LED element
24 n electrode
25 p electrode
26 bump
100 cured product of light-reflective anisotropic conductive adhesive
200 light-emitting device

The invention claimed is:

1. A light-reflective anisotropic conductive adhesive used for anisotropic conductive connection of a light-emitting element to a wiring board, the light-reflective anisotropic conductive adhesive comprising: a thermosetting resin composition containing a silicone resin and a curing agent; conductive particles; and light-reflective insulating particles, wherein the silicone resin is a glycidyloxyalkyl-alicyclic alkyl-modified organopolysiloxane.

2. The light-reflective anisotropic conductive adhesive according to claim 1, wherein the light-reflective insulating particle is at least one kind of inorganic particles selected from the group consisting of titanium oxide, boron nitride, zinc oxide, silicon oxide, and aluminum oxide.

3. The light-reflective anisotropic conductive adhesive according to claim 2, wherein the light-reflective insulating particle is a titanium oxide particle.

4. The light-reflective anisotropic conductive adhesive according to claim 1, wherein the light-reflective insulating particle has a spherical shape or a scale-like shape.

5. The light-reflective anisotropic conductive adhesive according to claim 1, wherein, when the light-reflective insulating particle has a spherical shape, a particle diameter thereof is 0.02 to 20 µm.

6. The light-reflective anisotropic conductive adhesive according to claim 1, wherein, when the light-reflective insulating particle has a scale-like shape, a longer diameter thereof is 0.1 to 100 µm, a shorter diameter thereof is 0.01 to 10 µm, and a thickness thereof is 0.01 to 10 µm.

7. The light-reflective anisotropic conductive adhesive according to claim 1, wherein a refractive index according to JIS K7142 of the light-reflective insulating particle is larger than a refractive index according to JIS K7142 of a cured product of the thermosetting resin composition.

8. The light-reflective anisotropic conductive adhesive according to claim 7, wherein the refractive index according to JIS K7142 of the light-reflective insulating particle is larger than the refractive index according to JIS K7142 of the cured product of the thermosetting resin composition at least by about 0.02.

9. The light-reflective anisotropic conductive adhesive according to claim 1, wherein the light-reflective insulating particle is a resin-coated metal particle formed by coating a surface of a scale-like or spherical metal particle with an insulating resin.

10. The light-reflective anisotropic conductive adhesive according to claim 9, wherein the light-reflective insulating particle is a resin-coated silver particle formed by coating a surface of a scale-like silver particle with an insulating resin.

11. The light-reflective anisotropic conductive adhesive according to claim 9, wherein, when the light-reflective insulating particle has a spherical shape, a particle diameter thereof is 0.02 to 20 µm.

12. The light-reflective anisotropic conductive adhesive according to claim 9, wherein, when the light-reflective insulating particle has a scale-like shape, a longer diameter thereof is 0.1 to 100 µm, a shorter diameter thereof is 0.01 to 10 µm, and a thickness thereof is 0.01 to 10 µm.

13. The light-reflective anisotropic conductive adhesive according to claim 9, wherein a refractive index according to JIS K7142 of the light-reflective insulating particle is larger than a refractive index according to JIS K7142 of a cured product of the thermosetting resin composition.

14. The light-reflective anisotropic conductive adhesive according to claim 13, wherein the refractive index according to JIS K7142 of the light-reflective insulating particle is larger than the refractive index according to JIS K7142 of the cured product of the thermosetting resin composition by about 0.02.

15. The light-reflective anisotropic conductive adhesive according to claim 9, wherein the insulating resin is an acrylic resin cross-linked by an isocyanate-based cross-linking agent.

16. The light-reflective anisotropic conductive adhesive according to claim 15, wherein the acrylic resin is formed by radical copolymerization of methyl methacrylate and 2-hydroxyethyl methacrylate.

17. The light-reflective anisotropic conductive adhesive according to claim 1, wherein an added amount of the light-reflective insulating particle is 1 to 50% by volume with respect to the thermosetting resin composition.

18. The light-reflective anisotropic conductive adhesive according to claim 1, wherein the glycidyloxyalkyl-alicyclic alkyl-modified organopolysiloxane is obtained by hydrosilylation of an alkylhydrogenpolysiloxane with alkenyl glycidyl ether and alkenylcycloalkane, and the curing agent is an acid anhydride-based curing agent.

19. The light-reflective anisotropic conductive adhesive according to claim 18, wherein the glycidyloxyalkyl-alicyclic alkyl-modified organopolysiloxane is obtained by hydrosilylation of 1 equivalent of an alkylhydrogenpolysiloxane having a weight average molecular weight of 300 or larger and 70,000 or lower with alkenyl glycidyl ether and alkenylcycloalkane in a total amount of 0.7 to 1.3 equivalents so that the alkenylcycloalkane is contained in an amount of 0.3 to 2 mole with respect to one mole of the alkenyl glycidyl ether.

20. The light-reflective anisotropic conductive adhesive according to claim 18, wherein the alkylhydrogenpolysiloxane is methylhydrogenpolysiloxane, the alkenyl glycidyl ether is allyl glycidyl ether, and the alkenylcycloalkane is vinyl cyclohexane.

21. The light-reflective anisotropic conductive adhesive according to claim 1, wherein the conductive particle is a light-reflective conductive particle composed of a core particle coated with a metal material and a light reflecting layer formed, on a surface of the core particle, from at least one kind of inorganic particles selected from the group consisting of titanium oxide, boron nitride, zinc oxide, silicon oxide, and aluminum oxide.

22. The light-reflective anisotropic conductive adhesive according to claim 21, wherein the light reflecting layer has a thickness which is 0.5 to 50% of a particle diameter of the core particle.

23. The light-reflective anisotropic conductive adhesive according to claim 21, wherein the inorganic particle constituting the light reflecting layer has a particle diameter of 0.02 to 4 µm.

24. The light-reflective anisotropic conductive adhesive according to claim 21, wherein an added amount of the light-reflective conductive particles with respect to the thermosetting resin composition is 5 to 30% by volume.

25. A light-emitting device obtained by flip-chip mounting a light-emitting element on a wiring board through the light-reflective anisotropic conductive adhesive according to claim 1.

26. The light-emitting device according to claim 25, wherein the light-emitting element is a light-emitting diode.

* * * * *